Oct. 15, 1957 R. B. TROUSDALE 2,810,080

TRANSISTOR CIRCUITS

Filed March 18, 1955

INVENTOR.
ROBERT B. TROUSDALE
BY F. H. Henson
AGENT

United States Patent Office 2,810,080

Patented Oct. 15, 1957

2,810,080

TRANSISTOR CIRCUITS

Robert B. Trousdale, Webster, N. Y., assignor, by mesne assignments, to General Dynamics Corporation, a corporation of Delaware Application March 18, 1955, Serial No. 495,289

4 Claims. (Cl. 307—88.5)

This invention relates in general to transistor circuits, and more particularly to biasing circuits for transistor circuits.

The biasing circuit herein disclosed has general application. It has been illustrated as embodied in a transistor blocking oscillator circuit, which circuit is also shown and described in conjunction with an electronic telephone system which forms the subject matter of my co-pending application, Serial No. 492,064, filed March 4, 1955, and assigned to the same assignee as the present invention.

In pulse generating circuits, such as blocking oscillator circuits, it is desirable to have as little impedance in the base and emitter circuits as possible so that a high amplitude output pulse may be produced. Of course, it is also necessary to bias the base and emitter in the reverse direction in the absence of trigger pulses so that the transistor is normally non-conductive. Bias voltage is conventionally obtained by dividing the source voltage across two or more series connected resistors. With this type of biasing, the conduction current of the transistor must necessarily flow through one of the bias resistors to one terminal of the source voltage so that the amplitude of the output pulse is limited thereby.

Accordingly, it is the general object of this invention to provide a new and improved biasing circuit for transistor circuits.

It is a more particular object of this invention to provide a new and improved biasing circuit for transistor circuits which has a low dynamic impedance.

The invention accomplishes the above cited objects by providing unidirectional conducting means, such as a crystal diode, in circuit with the emitter electrode. A current supply resistor is also provided in circuit with the emitter and the crystal diode. The crystal diode is poled so that it presents its forward impedance to the circuit at all times. The substantially constant voltage drop across the diode is utilized to bias the base and emitter electrodes in the reverse direction to normally hold the transistor non-conductive. When the transistor is rendered conductive, the current in the emitter circuit flows through the very low dynamic forward impedance of the diode so that the operation of the transistor circuit is not impaired by emitter degeneration.

Further objects and advantages of the invention will become apparent as the description proceeds and the features of novelty which characterize the invention will be pointed out in particularity in the claims annexed to and forming a part of this specification.

For a better understanding of the invention, reference may be had to the drawing in which.

Figure 1:
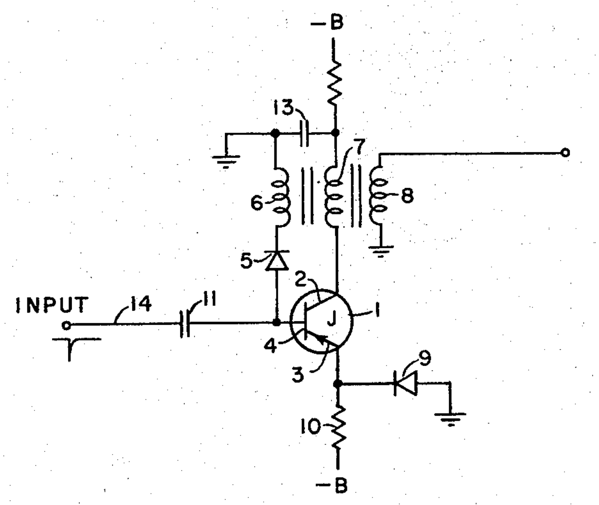
Fig. 1 shows a blocking oscillator circuit.

Referring to Figure 1, it can be seen that the blocking oscillator comprises PNP junction transistor 1, which may be type CK-722, having a collector 2, an emitter 3, and a base 4. The collector 2 is returned to a suitable source of negative potential, labeled —B, through winding 7 of the pulse transformer and resistor 12. The transistor is normally biased for non-conduction since the emitter is negative with respect to the base which is returned to a reference, or ground, potential, through crystal diode 5, which may be type CK-739, and winding 6 of the pulse transformer. Emitter bias is derived from the voltage division across crystal diode 9, which may be a silicon diode of type IN-138, and resistor 10 from current flow from a suitable source of negative potential, labeled —B, through resistor 10, and through the forward impedance of diode 9 to ground.

Figure 2:
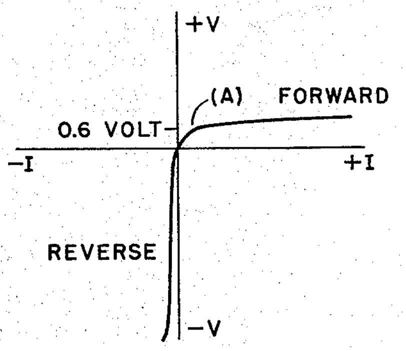
Fig. 2 shows the D.-C. voltage-current characteristic of a crystal diode.

As shown in Figure 2, the silicon diode voltage-current characteristic in the forward direction exhibits a sharp break point at about 0.6 volt, labeled point (A), below which little forward current flows and above which the current conduction increases rapidly with minute changes of voltage. This provides a characteristic similar to a voltage regulator tube, and through the use of a suitable current supply resistor, such as resistor 10, a stable source of —0.6 volt is obtained. This voltage is applied as a cutoff bias for transistor 1 and is overcome by an operating signal applied to the base circuit.

A negative going trigger pulse transmitted to the input conductor 14 and coupled through capacitor 11 to the base electrode 4 renders the transistor conductive. Since the trigger pulse is negative, diode 5 is rendered non-conductive so that the impedance of winding 6 of the pulse transformer to ground is effectively disconnected from in parallel with the base to emitter impedance of transistor 1 so that the trigger pulse may be transmitted in full to the base 4.

When the oscillator responds by firing, the voltage rises in collector winding 7 of the pulse transformer and is reflected into winding 6 of the pulse transformer in such direction so as to render diode 5 conductive and the base 4 more negative and thus assist in the build-up to saturation of the transistor. A very large current flows in both the base and emitter circuits. The current in the base circuit is made to flow through the forward impedance of diode 5 to ground. The current in the emitter circuit flows through the forward impedance of diode 9 to ground. Since the dynamic forward impedance of diode 9 is very low, the proper operation of the oscillator itself is not impaired by emitter degeneration.

When the transistor reaches saturation, the voltage in winding 7 of the pulse transformer ceases to increase so that the base is cut off and the transistor is rendered non-conductive. The output pulse from the oscillator is derived from the tertiary winding 8 of the pulse transformer and coupled to succeeding circuits. Capacitor 13 serves to decouple transient signals from the voltage source —B.

While there has been disclosed what is at present considered to be the preferred embodiment of the invention, other modifications will readily occur to those skilled in the art. It is not, therefore, desired that the invention be limited to the specific arrangement shown and described, and it is intended to cover in the appended claims all such modifications as fall within the true spirit and scope of the invention.

What is claimed is:

1. A transistor circuit comprising a transistor having base, emitter, and collector electrodes, unidirectional conducting means of the type which when biased in the forward direction exhibits a substantially constant voltage drop for all values of current flow above a certain critical value, means for producing a current flow in excess of said critical value through said unidirectional means, means for utilizing the voltage drop produced across said unidirectional conducting means responsive to said current flow to normally bias said base and emitter electrodes in the reverse direction so that the transistor is non-conductive, and means for applying an operating signal to said transistor to render said transistor conductive, said unidirectional conducting means being connected in said transistor circuit in such manner that it serves as a low impedance return for conduction current in said transistor.

2. The circuit of claim 1 in which the unidirectional conducting means is a crystal diode.

3. A transistor circuit comprising a transistor having base, emitter, and collector electrodes, a source of potential having first and second terminals, said base being returned to said first terminal, unidirectional conducting means of the type which when biased in the forward direction exhibits a substantially constant voltage drop for all values of current flow above a certain critical value, said unidirectional conducting means being connected between said emitter and said first terminal, resistive means connected between said emitter and said second terminal, said resistive means being of such value that the current flow between said first and second terminals and through said unidirectional conducting means exceeds the critical value so that the substantially constant voltage drop across said unidirectional conducting means is applied to said emitter electrode to normally bias said transistor for non-conduction, and means for applying an operating signal to said base to render said transistor conductive, said unidirectional conducting means being poled so as to present its low impedance to current flow between said emitter and said first terminal.

4. The circuit of claim 3 in which the unidirectional conducting means is a crystal diode.

References Cited in the file of this patent

UNITED STATES PATENTS 2,703,368 Wrathall ---------------- Mar. 1, 1955

OTHER REFERENCES

Wireless Engineer, May 1955, "Junction Transistor Trigger Circuits" by J. E. Flood.